United States Patent
Chen et al.

(10) Patent No.: US 11,865,588 B2
(45) Date of Patent: Jan. 9, 2024

(54) PROBE PIN CLEANING PAD AND CLEANING METHOD FOR PROBE PIN

(71) Applicant: Alliance Material Co., Ltd., Hsinchu County (TW)

(72) Inventors: Chun-Fa Chen, Hsinchu County (TW); Chi-Hua Huang, Hsinchu County (TW); Yu-Hsuen Lee, Hsinchu County (TW); Ching-Wen Hsu, Hsinchu County (TW); Chao-Hsuan Yang, Hsinchu County (TW); Ting-Wei Lin, Hsinchu County (TW); Chin-Kai Lin, Hsinchu County (TW); Chen-Ju Lee, Hsinchu County (TW)

(73) Assignee: Alliance Material Co., Ltd., Hsinchu County (TW)

( * ) Notice: Subject to any disclaimer, the term of this patent is extended or adjusted under 35 U.S.C. 154(b) by 37 days.

(21) Appl. No.: 17/691,129

(22) Filed: Mar. 10, 2022

(65) Prior Publication Data

US 2022/0193733 A1 Jun. 23, 2022

Related U.S. Application Data

(63) Continuation-in-part of application No. 17/095,747, filed on Nov. 12, 2020, now abandoned.
(Continued)

(30) Foreign Application Priority Data

Mar. 2, 2020 (TW) .................................. 109106766
Oct. 22, 2020 (TW) .................................. 109136656

(51) Int. Cl.
  *B08B 1/00* (2006.01)
  *B32B 7/06* (2019.01)
  (Continued)

(52) U.S. Cl.
  CPC .............. *B08B 1/001* (2013.01); *B24B 19/16* (2013.01); *B24D 11/00* (2013.01); *B32B 7/06* (2013.01);
  (Continued)

(58) Field of Classification Search
  CPC .......... B08B 1/001; B08B 1/00; B24D 11/00; B32B 7/06; B32B 7/12; B32B 27/20; B32B 2250/05; B32B 2264/0214; B32B 2264/10; B32B 2307/536; B32B 2307/54; B32B 2307/732; B32B 2432/00; B32B 27/36; B32B 27/40; B32B 29/00; B32B 2262/101; B32B 2264/0264; B32B 2264/1023;
  (Continued)

(56) References Cited

U.S. PATENT DOCUMENTS 6,777,966 B1 8/2004 Humphrey et al.
7,202,683 B2 4/2007 Humphrey et al.
(Continued)

*Primary Examiner* — Paresh Patel
(74) *Attorney, Agent, or Firm* — JCIPRNET

(57) ABSTRACT

A probe pin cleaning pad including a release layer or composite plate, an adhesive layer, a substrate layer, a cleaning layer, and a polishing layer is provided. The adhesive layer is disposed on the release layer or composite plate. The substrate layer is disposed on the adhesive layer. The cleaning layer is disposed on the substrate layer. The polishing layer is disposed on the cleaning layer. A cleaning method for a probe pin is also provided.

7 Claims, 10 Drawing Sheets

Related U.S. Application Data

(60) Provisional application No. 62/933,990, filed on Nov. 12, 2019.

(51) Int. Cl.
  *B32B 7/12* (2006.01)
  *B32B 27/28* (2006.01)
  *B32B 27/20* (2006.01)
  *B32B 27/08* (2006.01)
  *B24B 19/16* (2006.01)
  *B24D 11/00* (2006.01)
  *G01R 1/067* (2006.01)

(52) U.S. Cl.
  CPC ............... *B32B 7/12* (2013.01); *B32B 27/08* (2013.01); *B32B 27/20* (2013.01); *B32B 27/283* (2013.01); *B32B 2250/05* (2013.01); *B32B 2264/0214* (2013.01); *B32B 2264/10* (2013.01); *B32B 2307/536* (2013.01); *B32B 2307/54* (2013.01); *B32B 2307/732* (2013.01); *B32B 2432/00* (2013.01); *G01R 1/067* (2013.01)

(58) Field of Classification Search
  CPC .......... B32B 2264/1024; B32B 27/281; B32B 2264/0228; B32B 2264/0278; B32B 2264/104; B32B 2264/108; B32B 2264/12; B32B 2264/20; B32B 2307/748; B32B 5/02; B32B 25/08; B32B 25/20; B32B 27/285; B32B 27/286; B32B 27/308; B32B 2264/102; B32B 27/34; G01R 1/067
  See application file for complete search history.

(56) References Cited

U.S. PATENT DOCUMENTS

| | | | |
|---|---|---|---|
| 8,371,316 B2 | 2/2013 | Humphrey et al. | |
| 8,790,466 B2 | 7/2014 | Humphrey et al. | |
| 8,801,869 B2 | 8/2014 | Broz et al. | |
| 9,833,818 B2 | 12/2017 | Humphrey et al. | |
| 10,195,648 B2 | 2/2019 | Broz et al. | |
| 10,239,099 B2 | 3/2019 | Humphrey et al. | |
| 10,406,568 B2 | 9/2019 | Humphrey et al. | |
| 11,446,788 B2* | 9/2022 | Bajaj ...................... | B24D 18/00 |
| 2001/0035196 A1* | 11/2001 | Fujimura ................ | B08B 7/028 |
| | | | 134/1 |
| 2003/0027496 A1* | 2/2003 | Back ....................... | B24B 19/16 |
| | | | 451/36 |
| 2003/0089384 A1* | 5/2003 | Sato ........................ | B24D 18/00 |
| | | | 15/244.4 |
| 2003/0138644 A1* | 7/2003 | Khandros ................ | B08B 1/00 |
| | | | 428/447 |
| 2004/0083568 A1* | 5/2004 | Morioka ................. | B24D 15/04 |
| | | | 15/210.1 |
| 2005/0126590 A1* | 6/2005 | Sato ........................ | B32B 27/36 |
| | | | 15/210.1 |
| 2005/0260937 A1* | 11/2005 | Tunaboylu ........... | B24D 18/0072 |
| | | | 451/57 |
| 2006/0030247 A1* | 2/2006 | Sato ........................ | B24B 29/08 |
| | | | 451/49 |
| 2008/0242576 A1 | 10/2008 | Tamura et al. | |
| 2011/0132396 A1* | 6/2011 | Humphrey ................ | B08B 1/00 |
| | | | 15/104.93 |
| 2021/0141000 A1* | 5/2021 | Chen ....................... | G01R 31/20 |

\* cited by examiner

PROBE PIN CLEANING PAD AND CLEANING METHOD FOR PROBE PIN

CROSS-REFERENCE TO RELATED APPLICATION

This application is a continuation-in-part application of U.S. patent application Ser. No. 17/095,747, filed on Nov. 12, 2020, which claims the priority benefits of U.S. provisional application Ser. No. 62/933,990, filed on Nov. 12, 2019, Taiwan application serial no. 109106766, filed on Mar. 2, 2020 and Taiwan application serial no. 109136656, filed on Oct. 22, 2020. The entirety of each of the above-mentioned patent applications is hereby incorporated by reference herein and made a part of this specification.

BACKGROUND

Technical Field

The disclosure relates to a cleaning pad and a cleaning method for a probe pin, particularly to a probe pin cleaning pad and a cleaning method for a probe pin by using the probe pin cleaning pad.

Description of Related Art

In a test (for example but not limited to, final test (FT) or chip probing (CP)) of an electronic component, a probe pin is often employed for electrical measurement. Impurities or scratches, if any, present on the probe pin, may affect test results of the electronic component.

SUMMARY

The disclosure provides a probe pin cleaning pad and a cleaning method for a probe pin by using the probe pin cleaning pad, which are suitable for cleaning of probe pins.

A probe pin cleaning pad according to the disclosure includes a release layer or composite material, an adhesive layer, a substrate layer, a cleaning layer, and a polishing layer. The adhesive layer is disposed on the release layer or composite material. The substrate layer is disposed on the adhesive layer. The cleaning layer is disposed on the substrate layer. The polishing layer is disposed on the cleaning layer.

In an embodiment of the disclosure, the release layer or composite material, the adhesive layer, the substrate layer, the cleaning layer, and the polishing layer are sequentially stacked.

In an embodiment of the disclosure, two opposite surfaces of the cleaning layer is directly contact the substrate layer and the polishing layer, and in the process of cleaning an object by using the probe pin cleaning pad, the polishing layer is a first layer in contact with the object among the layers of the probe pin cleaning pad.

In an embodiment of the disclosure, the cleaning layer has a Mohs hardness of less than 7, or has a Young's modulus of less than or equal to 100 kg/cm2.

In an embodiment of the disclosure, a material of the cleaning layer includes silicone resin having a cross-linked network structure and organic particles.

In an embodiment of the disclosure, the organic particles have a Mohs hardness of less than 7.

In an embodiment of the disclosure, the organic particles are not catalysts during a reaction for forming the silicone resin.

In an embodiment of the disclosure, a material of the polishing layer includes resin and inorganic particles.

In an embodiment of the disclosure, the inorganic particles have a Mohs hardness of large than or equal to 7.

In an embodiment of the disclosure, a Young's modulus of the polishing layer is larger than a Young's modulus of the cleaning layer.

A cleaning method for a probe pin according to the disclosure includes the following. In step 1, an electronic component is tested by the probe pin. In step 2, after step 1, the probe pin is cleaned by the probe pin cleaning pad of any one of the foregoing embodiments.

In an embodiment of the disclosure, step 1 and step 2 are performed in-situ or on-line.

Based on the above, in the probe pin cleaning pad and the cleaning method for a probe pin by using the probe pin cleaning pad according to the disclosure, since the cleaning layer is adapted to adhere to and cover a substance on the probe pin, the probe pin cleaning pad and the cleaning method for a probe pin are suitable for cleaning of probe pins and may reduce scratches on the probe pins.

DESCRIPTION OF THE EMBODIMENTS

Figure 1:
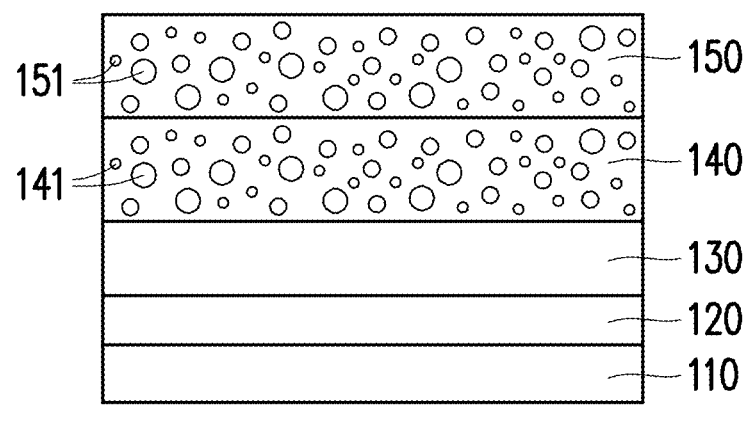
FIG. 1 is a schematic cross-sectional view of a probe pin cleaning pad according to a first embodiment of the disclosure.

In the drawings, sizes of elements or layers may be enlarged or reduced for clarity. In addition, some layers or components may be omitted from the drawings for clarity.

Directional terms (for example, up, down, right, left, front, back, top, and bottom) as used herein are made only with reference to the figures as drawn and are not intended to imply absolute orientation.

A numerical value indicated in the specification may include the numerical value and a deviation value within a range acceptable to one of ordinary skill in the art. The above deviation value may be one or more standard deviations in a manufacturing or measurement process, or calculation error caused by factors such as the number of digits used in calculation or conversion, rounding, or error propagation.

FIG. 1 is a schematic cross-sectional view of a probe pin cleaning pad according to a first embodiment of the disclosure.

Referring to FIG. 1, a probe pin cleaning pad 100 may include a release layer 110, an adhesive layer 120, a substrate layer 130, a cleaning layer 140, and a polishing layer 150. The release layer 110 is located under the adhesive layer 120 (in a lower part of FIG. 1). The adhesive layer 120 is located under the substrate layer 130 (in the lower part of FIG. 1). The cleaning layer 140 is located on the substrate layer 130 (in an upper part of FIG. 1). The polishing layer 150 is located on the cleaning layer 140 (in an upper part of FIG. 1). That is, the adhesive layer 120 and the cleaning layer 140 are respectively located on two opposite sides of the substrate layer 130.

In the present embodiment, the probe pin cleaning pad 100 may include the release layer 110, the adhesive layer 120, the substrate layer 130, the cleaning layer 140 and the polishing layer 150 that are disposed in a stacked manner. For example, two opposite surfaces of the adhesive layer 120 may directly contact the release layer 110 and the substrate layer 130, two opposite surfaces of the substrate layer 130 may directly contact the adhesive layer 120 and the cleaning layer 140, and two opposite surfaces of the cleaning layer 140 may directly contact the substrate layer 130 and the polishing layer 150.

In the present embodiment, the release layer 110 may include a release film or release paper. However, the disclosure is not limited thereto. In one embodiment, a material of the release film serving as the release layer 110 may include polyethylene terephthalate (PET). In one embodiment, the release film may have a thickness of 25 micrometers ($\mu m$) to 175 $\mu m$. However, the disclosure is not limited thereto. In one embodiment, the release film may have a release force of 2 gf/25 mm to 200 gf/25 mm. However, the disclosure is not limited thereto.

In the present embodiment, the adhesive layer 120 has a thickness of greater than or equal to 10 $\mu m$ and less than or equal to 50 $\mu m$. For example, the adhesive layer 120 basically has a thickness of 25 $\mu m$.

If the adhesive layer 120 has a thickness of less than 10 $\mu m$, adhesion force of the adhesive layer 120 may be reduced.

If the adhesive layer 120 has a thickness of greater than 50 $\mu m$, the overall thickness of the probe pin cleaning pad 100 may be increased due to the excessive thickness of the adhesive layer 120, thus increasing the material cost or affecting the use of the other layers.

In the present embodiment, the substrate layer 130 has a thickness of greater than or equal to 12 $\mu m$ and less than or equal to 200 $\mu m$. For example, the substrate layer 130 basically has a thickness of 100 $\mu m$ to 125 $\mu m$.

If a substrate layer (e.g., same or similar material as the substrate layer 130, but with a different thickness) has a thickness of less than 12 $\mu m$, insufficient support is provided. Moreover, or alternatively, an object to be cleaned (for example, a probe pin 91 in FIG. 3C, FIG. 3F, FIG. 4A or FIG. 4B) may pierce the substrate layer having a thickness of less than 12 $\mu m$.

If a substrate layer (e.g., same or similar material as the substrate layer 130, but with a different thickness) has a thickness of greater than 200 $\mu m$, the overall thickness of the probe pin cleaning pad (including the substrate layer having a thickness of greater than 200 $\mu m$) may be increased, thus increasing the material cost or affecting the other layers.

In the present embodiment, a material of the substrate layer 130 may include polyethylene terephthalate (PET), polyimide (PI), polyether ether ketone (PEEK), polyethylenimine (PEI), polyamide (PA), polyethersulfone (PES), polyethylene naphthalate (PEN), or a stack of the foregoing or a combination thereof.

In the present embodiment, the material of the polishing layer 150 may include a plurality of inorganic particles 151 and a resin wrapped therein. In addition, for clarity, not all inorganic particles are labelled in the corresponding figures (e.g., FIG. 1 or 2).

In the present embodiment, a material of the resin of the polishing layer 150 may include silicone, polyurethane (PU), poly(methyl methacrylate) (PMMA; also known as acrylic), or a stack of the foregoing or a combination thereof.

The aforementioned inorganic particles 151 include spherical or polygonal aluminum oxide particles, spherical or polygonal silicon carbide particles, spherical or polygonal diamond particles, spherical or polygonal quartz particles, spherical or polygonal zirconia ($ZrO_2$) particles, spherical or polygonal ceria ($CeO_2$) particles or a combination thereof. The particle size of the aforementioned inorganic particles is about 0.02 $\mu m$~50 $\mu m$, and the aforementioned inorganic particles have a Mohs hardness of larger than or equal to 7.

In one embodiment, the particles including in the polishing layer 150 may not include organic particles.

In the present embodiment, the polishing layer 150 has a thickness of greater than or equal to 5 $\mu m$ and less than or equal to 200 $\mu m$.

If a polishing layer (e.g., same or similar material as the polishing layer 150, but with a different thickness) has a thickness of less than 5 $\mu m$, the cleaning ability of the probe pin cleaning pad (including the polishing layer having a thickness of less than 5 $\mu m$) may be reduced. Moreover, or alternatively, if the polishing layer (e.g., same or similar material as the polishing layer 150, but with a different thickness) has a thickness of less than 5 $\mu m$, substances (for example, a solder that forms the conductive terminal, or an aluminum material, zinc material, copper material, carbon material or eutectic composition that forms the contact pad) attached to an object (for example, a probe pin 91 in FIG. 3C, FIG. 3F, FIG. 4A or FIG. 4B) may be hard to be separated from each other via the probe pin cleaning pad.

If a polishing layer (e.g., same or similar material as the polishing layer 150, but with a different thickness) has a thickness of greater than 200 $\mu m$, scratches, cuts and/or deformations may be caused on an object (for example, the probe pin 91 in FIG. 3C, FIG. 3F, FIG. 4A to FIG. 4D) to be cleaned.

In an embodiment, in the process of cleaning an object (for example, the probe pin 91 in FIG. 3C, FIG. 3F, FIG. 4A to FIG. 4D) by using the probe pin cleaning pad 100, the polishing layer 150 is the first layer in contact with the aforementioned object among the layers of the probe pin cleaning pad 100.

In the present embodiment, the material of the cleaning layer 140 may include a plurality of organic particles 141 and a silicone resin wrapped therein. In addition, for clarity, not all organic particles are labelled in the corresponding figures (e.g., FIG. 1 or 2).

The aforementioned organic particles 141 include spherical or polygonal particles formed by an organic compound having an alkenyl group, an ether group, an amide group, an amine group, a carboxyl group, an ester group, an alcohol group, a silyl group, an alkoxy group, an alkoxysilyl group or a combination thereof. The particle size of the aforementioned organic particles is about 0.05 $\mu m$~30 $\mu m$.

The aforementioned silicon resin is, for example, an organic polymer formed by organosiloxane with a high cross-linked network structure. The aforementioned organosiloxane may include polydimethylsiloxane, polymethylphenylsiloxane, methylpolysilxane or a combination thereof. The glass-transition temperature (Tg) of the aforementioned silicon resin is lower than room temperature, for example, about −60°~−20° C. The weight average molecular weight of the aforementioned silicone resin is, for example, about 20,000 g/mol to 200,000 g/mol.

The cleaning layer 140 may be formed as follows. The chlorine group of the chlorosilane (e.g., methyltrichlorosilane, dimethyldichlorosilane, phenyltrichlorosilane, diphenyldichlorosilane, methylphenyldichlorosilane or a combination thereof) is replaced by a hydroxyl group by a hydrolysis reaction (may be referred as hydrolysis reaction) to produce the corresponding acidic hydrolyzate. The initial product (e.g., the aforementioned acidic hydrolysate) of the hydrolysis reaction may be a mixture of cyclic, linear and cross-linked polymers containing hydroxyl groups. The acidic hydrolysate could be washed with water to substantially remove the acid, resulting in a substantially neutral (e.g., pH=7±1) primary polycondensate. The aforementioned polycondensate is thermally oxidized in air or/and further polycondensed by a catalyst (may be referred as a dehydration polymerization reaction), then, a silicon resin with a high cross-linked network structure is formed by a dehydration polymerization reaction. The morphology of the silicone resin with high cross-linked network structure may be similar to a colloid, a gel or a paste. Then, a given organic particle 141 may be added to the silicone resin with high cross-linked network structure. By an accompanying stirring step during the mixing process, the distribution of the organic particles 141 in the silicone resin with high cross-linked network structure may be more uniform. There is basically no chemical reaction between the silicone resin with high cross-linked network structure and the aforementioned organic particles. That is, the aforementioned organic particles 141 are not catalysts during the dehydration polymerization reaction or any reaction for forming the silicone resin. In other words, under the same or similar reaction conditions (e.g., at the same or similar reaction temperature), regardless of whether the aforementioned organic particles are added, the rate constant of the reaction for forming the silicone resin are substantially the same.

In the present embodiment, the cleaning layer 140 has a Mohs hardness of less than 7. If a cleaning layer (e.g., same or similar thickness as the cleaning layer 140, but with a different hardness) has a Mohs hardness of greater than 7, scratches may be caused on the object (for example, the probe pin 91 in FIG. 3C, FIG. 3F, FIG. 4A to FIG. 4D) to be cleaned.

In the present embodiment, the cleaning layer 140 has a Young's modulus of less than or equal to 100 kg/cm². If a cleaning layer (e.g., same or similar thickness as the cleaning layer 140, but with a different modulus of elasticity in tension or compression) has a Young's modulus of greater than 100 kg/cm², when the object to be cleaned (for example, the probe pin 91 in FIG. 3C, FIG. 3F, FIG. 4A to FIG. 4D) and the probe pin cleaning pad 100 contact each other, the cleaning ability of the cleaning layer may be reduced.

In one embodiment, the cleaning layer 140 has a Young's modulus of greater than or equal to 30 kg/cm². If a cleaning layer (e.g., same or similar thickness as the cleaning layer 140, but with a different modulus of elasticity in tension or compression) has a Young's modulus of less than 30 kg/cm², the cleaning ability of the cleaning layer may be reduced.

In one embodiment, the cleaning layer 140 may have a Young's modulus of greater than or equal to 30 kg/cm² and less than or equal to 100 kg/cm².

In one embodiment, the cleaning layer 140 may further have a Young's modulus of less than or equal to 70 kg/cm². In one embodiment, the cleaning layer 140 may have a Young's modulus of greater than or equal to 30 kg/cm² and less than or equal to 70 kg/cm².

In one embodiment, the cleaning layer 140 may further have a Young's modulus of greater than or equal to 50 kg/cm². In one embodiment, the cleaning layer 140 may have a Young's modulus of greater than or equal to 50 kg/cm² and less than or equal to 100 kg/cm².

In one embodiment, the cleaning layer 140 may further have a Young's modulus of greater than or equal to 50 kg/cm² and less than or equal to 70 kg/cm². When the object to be cleaned (for example, the probe pin 91 in FIG. 3C, FIG. 3F, FIG. 4A to FIG. 4D) and the probe pin cleaning pad 100 contact each other, the cleaning ability and the number of uses of the cleaning layer 140 may further be improved.

In one embodiment, the cleaning layer 140 may have a Mohs hardness of less than 7, and may have a Young's modulus of less than or equal to 100 kg/cm², or further less than or equal to 70 kg/cm².

In one embodiment, the cleaning layer 140 may have a Mohs hardness of less than 7, and may have a Young's modulus of greater than or equal to 30 kg/cm², or further greater than or equal to 50 kg/cm².

In one embodiment, the cleaning layer 140 has a Mohs hardness of less than 7. Moreover, the cleaning layer 140 may have a Young's modulus of greater than or equal to 30 kg/cm² and less than or equal to 100 kg/cm².

In one embodiment, the cleaning layer 140 has a Mohs hardness of less than 7. Moreover, the cleaning layer 140 may have a Young's modulus of greater than or equal to 30 kg/cm² and less than or equal to 70 kg/cm².

In one embodiment, the cleaning layer 140 has a Mohs hardness of less than 7. Moreover, the cleaning layer 140 may have a Young's modulus of greater than or equal to 50 kg/cm² and less than or equal to 100 kg/cm².

In one embodiment, the cleaning layer 140 has a Mohs hardness of less than 7. Moreover, the cleaning layer 140 may have a Young's modulus of greater than or equal to 70 kg/cm² and less than or equal to 70 kg/cm². When the object to be cleaned (for example, the probe pin 91 in FIG. 3C, FIG. 3F, FIG. 4A to FIG. 4D) and the probe pin cleaning pad 100 contact each other, the cleaning ability and the number of uses of the cleaning layer 140 may further be improved, and the risk of wear (for example, the occurrence of scratches) of the object to be cleaned (for example, the probe pin 91 in FIG. 3C, FIG. 3F, FIG. 4A to FIG. 4D) may be reduced.

In one embodiment, the organic particles may be adapted to be adhered or bonded to a metal material (for example, solder) and/or a metal oxide material.

In one embodiment, the organic particles 141 may further be adapted to be adhered or bonded (e.g., Van der Waals bonding) to the cross-linked network structure of the silicon resin. For example, in the organic compound used to form the organic powder particles 141, a functional group (e.g., an alkenyl group, an ether group, an amide group, an amine group, a carboxyl group, an ester group, an alcohol group, a silyl group, an alkoxy group, or an alkoxysilyl group) thereof may be suitable for adhering or bonding the cross-linked network structure of the silicon resin.

In one embodiment, the organic particles 141 may include spherical or polygonal poly(methyl methacrylate) (PMMA) particles with a surface treatment, spherical or polygonal polystyrene (PS) particles with a surface treatment, spherical or polygonal polysiloxane particles with a surface treatment or a combination thereof. The aforementioned treatment may include: perform an appropriate reaction to substitute a hydrogen on the surface of the polymer particle (e.g., PMMA particle, PS particle, or polysiloxane particle) with a functional group (e.g., an alkenyl group, an ether group, an amide group, an amine group, a carboxyl group, an ester group, an alcohol group, a silyl group, an alkoxy group, or an alkoxysilyl group) by an appropriate reaction.

In one embodiment, the organic particles 141 have a Mohs hardness of less than 7. If organic particles (e.g., same or similar size as the organic particles 141, but with a different hardness) have a Mohs hardness of greater than 7, scratches may be caused on the object to be cleaned (for example, the probe pin 91 in FIG. 3C, FIG. 3F, FIG. 4A to FIG. 4D).

In one embodiment, the material of the cleaning layer 140 may include no inorganic material.

In the present embodiment, the cleaning layer 140 has a thickness of greater than or equal to 150 μm and less than or equal to 500 μm. If a cleaning layer (e.g., same or similar material as the cleaning layer 140, but with a different thickness) has a thickness of less than 150 μm, the cleaning ability of the probe pin cleaning pad 100 may be reduced. If a cleaning layer (e.g., same or similar material as the cleaning layer 140, but with a different thickness) has a thickness of greater than 500 μm, the risk of peeling of the cleaning layer 140 itself may be increased.

In one embodiment, the cleaning layer 140 has a thickness of greater than or equal to 230 μm and less than or equal to 300 μm. For example, in the present embodiment, the cleaning layer 140 may basically have a thickness of 265 μm.

In the present embodiment, the probe pin cleaning pad 100 may serve as a probe card cleaning pad. However, the disclosure is not limited thereto.

Figure 2:
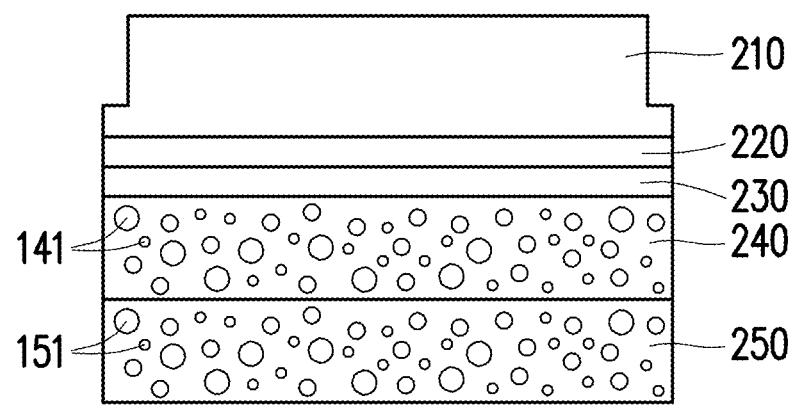
FIG. 2 is a schematic cross-sectional view of a probe pin cleaning pad according to a second embodiment of the disclosure.

FIG. 2 is a schematic cross-sectional view of a probe pin cleaning pad according to a second embodiment of the disclosure.

Referring to FIG. 2, a probe pin cleaning pad 200 may include a composite material 210, an adhesive layer 220, a substrate layer 230, a cleaning layer 240, and a polishing layer 250. The adhesive layer 220 is located under the composite material 210 (in a lower part of FIG. 2). The substrate layer 230 is located under the adhesive layer 220 (in the lower part of FIG. 2). The cleaning layer 240 is located under the substrate layer 230 (in the lower part of FIG. 2). The polishing layer 250 is located under the cleaning layer 240 (in the lower part of FIG. 2).

In the present embodiment, the probe pin cleaning pad 200 may include the composite material 210, the adhesive layer 220, the substrate layer 230, the cleaning layer 240 and the polishing layer 250 that are disposed in a stacked manner. For example, two opposite surfaces of the adhesive layer 220 may directly contact the composite material 210 and the substrate layer 230, two opposite surfaces of the substrate layer 230 may directly contact the adhesive layer 220 and the cleaning layer 240, and two opposite surfaces of the cleaning layer 240 may directly contact the substrate layer 230 and the polishing layer 250.

In the present embodiment, the composite material 210 may include a rigid plate-shaped body. However, the disclosure is not limited thereto. In one embodiment, a material of the rigid plate-shaped body serving as the composite material 210 may include a silicon substrate, a glass fiber board (for example, FR4 board), a rigid plastic substrate (for example, acrylic sheet), or a composite plate of the foregoing. In one embodiment, the composite plate may have a thickness of 100 μm to 2000 μm. However, the disclosure is not limited thereto. For example, the composite plate basically has a thickness of 750 μm.

In the present embodiment, a material of the adhesive layer 220 of the probe pin cleaning pad 200 may be the same as or similar to the material of the adhesive layer 120 of the foregoing embodiments, and both elements have the same or similar uses or properties. Therefore, a detailed description will be omitted.

In the present embodiment, a material of the substrate layer 230 of the probe pin cleaning pad 200 may be the same as or similar to the material of the substrate layer 130 of the foregoing embodiments, and both elements have the same or similar uses or properties. Therefore, a detailed description will be omitted.

In the present embodiment, a material of the cleaning layer 240 of the probe pin cleaning pad 200 may be the same as or similar to the material of the cleaning layer 140 of the foregoing embodiments, and both elements have the same or similar uses or properties. Therefore, a detailed description will be omitted.

In the present embodiment, the cleaning layer 240 may basically have a thickness of 150 μm.

In the present embodiment, a material of the polishing layer 250 of the probe pin cleaning pad 200 may be the same as or similar to the material of the polishing layer 150 of the foregoing embodiments, and both elements have the same or similar uses or properties. Therefore, a detailed description will be omitted.

In the present embodiment, the probe pin cleaning pad 200 may serve as a test socket cleaning pad. However, the disclosure is not limited thereto.

In the disclosure, a probe pin may be cleaned by the probe pin cleaning pad 100 or 200 of any one of the foregoing embodiments. It is worth noting that the disclosure does not limit the use of the probe pin cleaning pad 100 or 200 of any one of the foregoing embodiments.

A cleaning method for a probe pin may include the following steps. In step 1, an electronic component is tested by the probe pin. In step 2, after step 1, the probe pin is cleaned by the probe pin cleaning pad 100 or 200 of any one of the foregoing embodiments.

The cleaning method for a probe pin is exemplified as follows. Referring to FIG. 3A to FIG. 4D, FIG. 3A to FIG. 3F are schematic views of a cleaning method for a probe pin according to an embodiment of the disclosure, and FIG. 4A to FIG. 4D are schematic enlarged partial cross-sectional views of a cleaning method for a probe pin according to an embodiment of the disclosure.

Figure 3A:
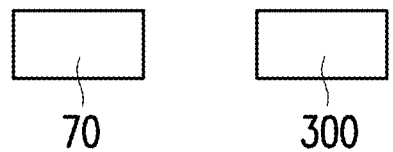
FIG. 3A to FIG. 3F are schematic views of a cleaning method for a probe pin according to an embodiment of the disclosure.
Figure 3B:
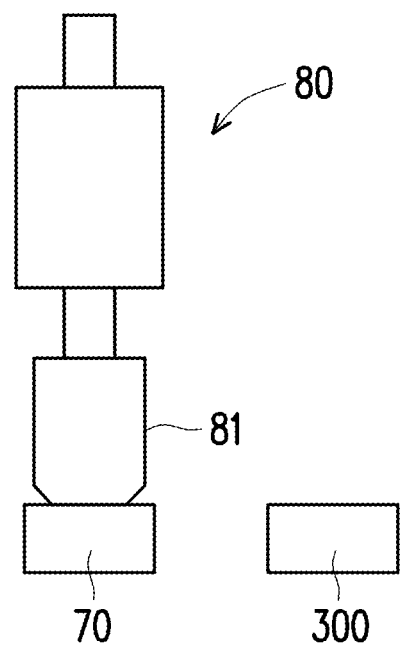
Figure 3C:
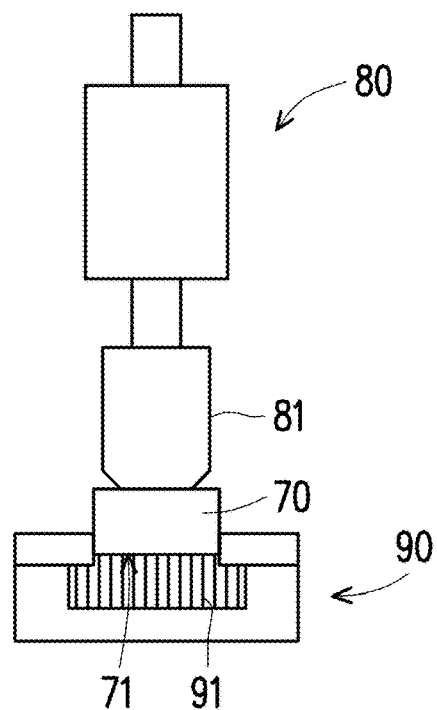

Referring to FIG. 3A to FIG. 3C, an electronic component 70 may be electrically tested by a common test method using the probe pin 91.

As an example, in FIG. 3A, the electronic component 70 and a probe pin cleaning pad 300 are provided.

In the present embodiment, the electronic component 70 is, for example, a bare die or a chip package. However, the disclosure is not limited thereto.

In the present embodiment, the probe pin cleaning pad 300 may be the same as or similar to the probe pin cleaning pad 200 of the foregoing embodiments. That is, a material of a substrate layer 330 of the probe pin cleaning pad 300 may be the same as or similar to the material of the substrate layer 230 of the foregoing embodiments, and both elements have the same or similar uses or properties. Therefore, a detailed description will be omitted. Alternatively, a material of a cleaning layer 340 of the probe pin cleaning pad 300 may be the same as or similar to the material of the cleaning layer 240 of the foregoing embodiments, and both elements have the same or similar uses or properties (for example, Mohs hardness). In addition, the organic particles (e.g., same or similar as the organic particles 141) of the cleaning layer 340 are omitted to be illustrated for clarity. Therefore, a detailed description will be omitted. Alternatively, a material of a polishing layer 350 of the probe pin cleaning pad 300 may be the same as or similar to the material of the polishing layer 150 of the foregoing embodiments, and both elements have the same or similar uses or properties. In addition, the inorganic particles (e.g., same or similar as the inorganic particles 151) of the polishing layer 350 are omitted to be illustrated for clarity. Therefore, a detailed description will be omitted. In addition, an adhesive layer (which is, for example, the same as or similar to the adhesive layer 120 or 220) and a composite material (which is, for example, the same as or similar to the composite material 210) of the probe pin cleaning pad 300 are omitted from illustration in the drawings.

In one embodiment (not shown), the probe pin cleaning pad 300 may be the same as or similar to the probe pin cleaning pad 100 of the foregoing embodiments.

Then, as shown in FIG. 3B, the electronic component 70 to be tested may be picked up by a pick-up head 81 of a pick-up-and-place device 80.

Then, as shown in FIG. 3C, by the pick-up-and-place device 80, the electronic component 70 to be tested may be placed on a test device 90.

The test device 90 has, for example, multiple probe pins 91. The probe pin 91 may contact a conductive terminal (for example, solder ball) (not shown) or a contact pad (not shown) on a surface under test 71 of the electronic component 70, so as to test the electronic component 70. For example, pressure may be applied to the electronic component 70 to be tested and/or the probe pin 91, so that the conductive terminal or contact pad on the surface under test 71 of the electronic component 70 to be tested and the probe pin 91 contact each other.

In one embodiment, during the contact between the electronic component 70 and the probe pin 91, some substances (for example, a solder that forms the conductive terminal, or an aluminum material, zinc material, copper material, carbon material or eutectic composition that forms the contact pad) may be attached to the probe pin 91.

In the present embodiment, the test method is, for example, final test (FT). However, the disclosure is not limited thereto. In one embodiment, the test method may be chip probing (CP).

After the exemplary test shown in FIG. 3A to FIG. 3C, the probe pin 91 may be cleaned by the probe pin cleaning pad 300 in a similar operation manner.

Figure 3D:
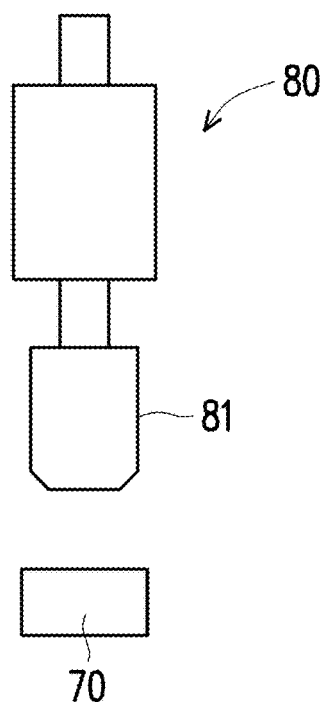

Taking FIG. 3C to FIG. 3D as an example, after the electronic component 70 is tested, the electronic component 70 and the probe pin 91 may be separated from each other, and the electronic component 70 may be placed by the pick-up-and-place device 80.

In one embodiment, during the separation of the electronic component 70 and the probe pin 91, some substances (for example, a solder that forms the conductive terminal, or an aluminum material, zinc material, copper material, carbon material or eutectic composition that forms the contact pad) may peel off and be attached to the probe pin 91.

Figure 3E:
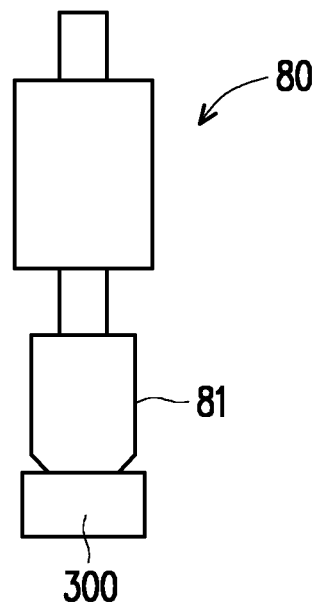

Then, as shown in FIG. 3E, the probe pin cleaning pad 300 may be picked up by the pick-up head 81 of the pick-up-and-place device 80.

Figure 3F:
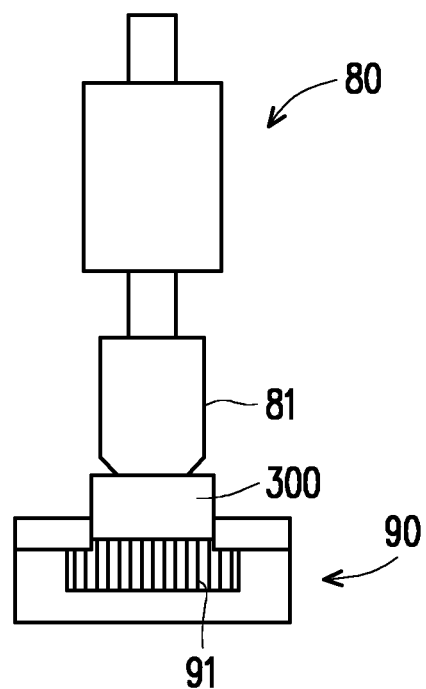

Then, as shown in FIG. 3F, by the pick-up-and-place device 80, the probe pin cleaning pad 300 may be placed on the test device 90, so that the probe pin 91 can be cleaned by the probe pin cleaning pad 300.

For example, pressure may be applied to the probe pin cleaning pad 300 and/or the probe pin 91, so that the probe pin cleaning pad 300 and the probe pin 91 contact each other, causing a substance 99 (which is, for example, a solder, an aluminum material, a zinc material, a copper material, a carbon material or eutectic composition; marked or shown in FIG. 4A to FIG. 4D) attached to the probe pin 91 to adhere to the cleaning layer 340 of the probe pin cleaning pad 300. After that, the probe pin cleaning pad 300 and the probe pin 91 may be separated from each other, and the substance 99 attached to the probe pin 91 may be reduced by the probe pin cleaning pad 300.

For details, please refer to FIG. 4A to FIG. 4D.

Figure 4A:
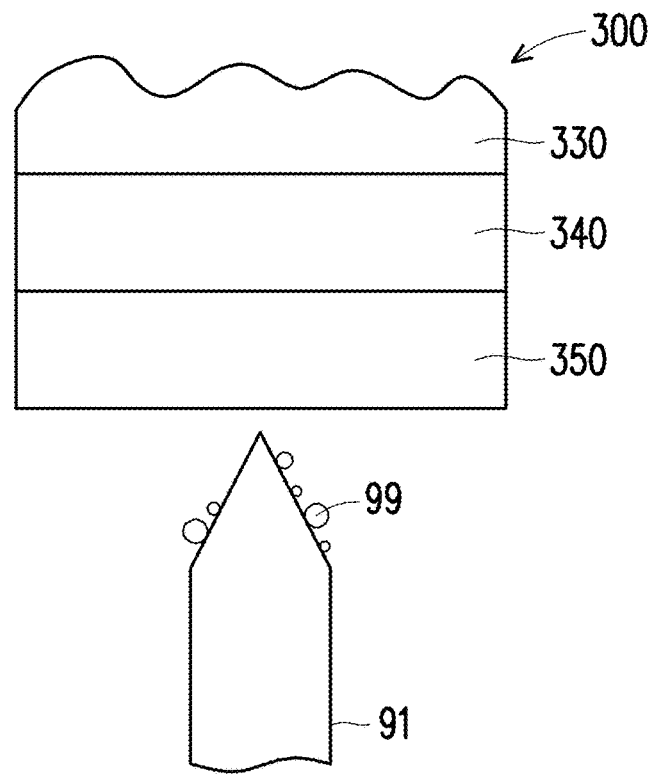
FIG. 4A to FIG. 4D are schematic enlarged partial cross-sectional views of a cleaning method for a probe pin according to an embodiment of the disclosure.
Figure 4B:
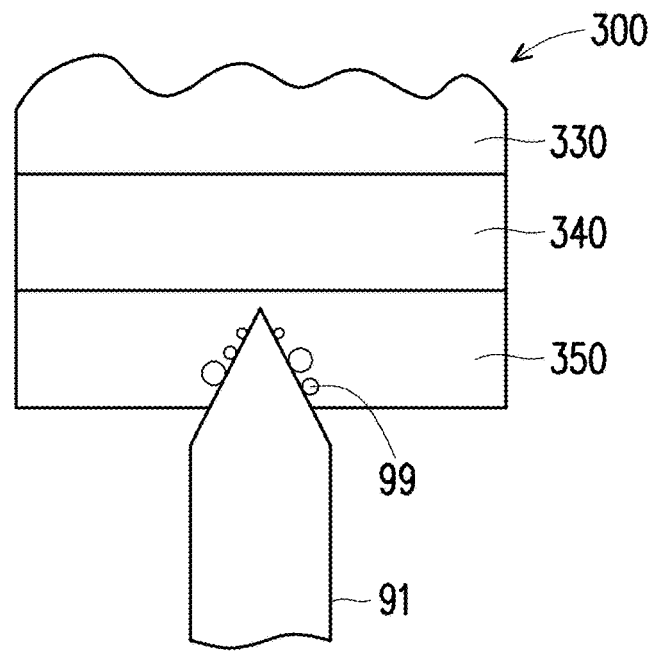

As shown in FIG. 4A to FIG. 4B, one end (that is, one end for contacting the electronic component 70) of the probe pin 91 for testing pierces may penetrate into the polishing layer 350 of the probe pin cleaning pad 300. The substance 99 attached to the probe pin 91 may be loosened from the probe pin 91 by the inorganic particles in the polishing layer 350. For example, the substance 99 attached to the probe pin 91 may be rubbed against the inorganic particles in the polishing layer 350 during the process of the probe pin 91 penetrating into the polishing layer 350.

Figure 4C:
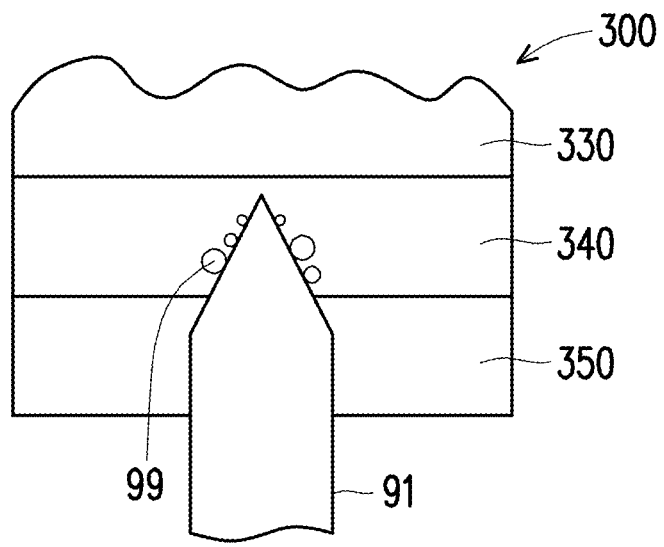

As shown in FIG. 4B to FIG. 4C, the aforementioned end of the probe pin 91 may further penetrate into the cleaning layer 340 of the probe pin cleaning pad 300 during the process of the probe pin 91 penetrating into the polishing layer 350.

As shown in FIG. 4C, since during the process of the probe pin 91 penetrating into the polishing layer 350, the substance 99 attached to the probe pin 91 may have be loosened from the probe pin 91, so the organic particles of the cleaning layer 340 may be used for removing the substance 99 from the probe pin 91 more easily when the probe pin 91 penetrating into the cleaning layer 340.

Figure 4D:
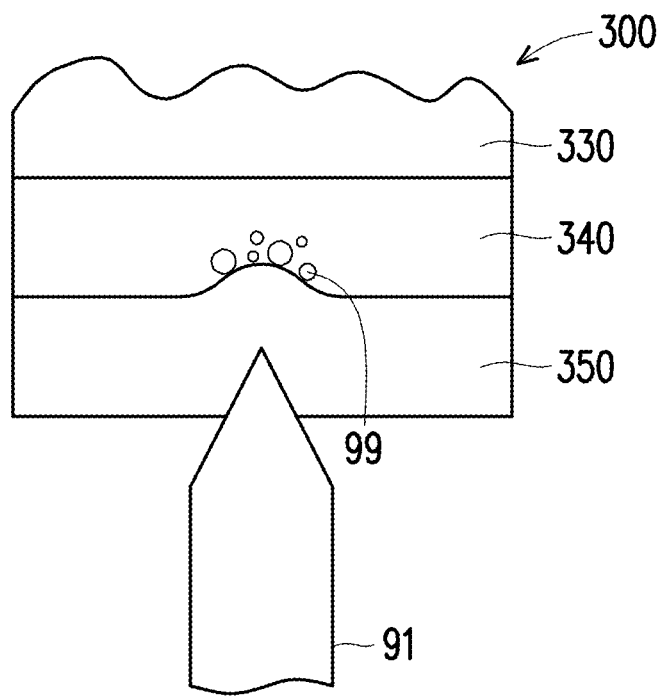

As shown in FIG. 4C to 4D, during the process of the probe pin 91 separating from the polishing layer 350, most of the substance 99 being removed from the probe pin 91 may be captured and/or trapped in the cross-linked network structure of the silicon resin of the cleaning layer 340. Moreover, since the Young's modulus of the cleaning layer 340 is small than the Young's modulus of the polishing layer 350, most of the substance 99 being removed from the probe pin 91 will be captured and/or trapped by the cleaning layer 340 during the aforementioned separation process. As such, the possibility of substance 99 re-attaching and re-adhering to probe pin 91 may be reduced during the aforementioned separation process. For the avoidance of doubt, it is noted that the reported Young's modulus of a layer is determined the whole layer (e.g., the whole cleaning layer 340 may include the silicone resin having a cross-linked network structure and the organic particles, and/or the whole polishing layer 350 may include the silicone resin having a cross-linked network structure and the inorganic particles) by a standardized test (e.g., ASTM D882) and corresponding calculations.

As shown in FIG. 4D, after the probe pin cleaning pad 300 and the probe pin 91 are separated from each other, the amount of the substance 99 attached to and/or coated on the probe pin 91 may be reduced.

In the method or step for cleaning the probe pin 91 by the probe pin cleaning pad 100, 200 or 300 of any one of the foregoing embodiments of the disclosure, the probe pin 91 may not be disassembled or separated from the test device 90. Moreover, the cleaning of the probe pin 91 may be performed under the same or similar recipe for testing the electronic component 70. That is, the steps of the method for cleaning the probe pin 91 may be performed in-situ or on-line.

It is worth noting that, FIG. 3A to FIG. 4D only exemplarily describe one method for cleaning the probe pin 91, and the type of the probe pin 91 is not limited in the disclosure. For example, in FIG. 3A to FIG. 4D, the probe pin 91 as shown is a vertical probe pin. However, the disclosure is not limited thereto. In one embodiment (not shown), the probe pin cleaning pad 100, 200 or 300 of any one of the foregoing embodiments of the disclosure may be employed for cleaning of a cantilever probe pin by a similar common test method.

EXPERIMENTAL EXAMPLES AND COMPARATIVE EXAMPLES

The disclosure will be specifically described by way of experimental examples and comparative examples shown below. The embodiments of the disclosure may include, but are not limited to, the following experimental examples. In addition, in the later-described comparative examples, the description "a cleaning layer-like layer" may refer to a layer different from the cleaning layer of the disclosure. For example, the "cleaning layer-like layer" may be of a different composition from that of the cleaning layer of the disclosure. For example, the "cleaning layer-like layer" may be of a composition partially the same as that of the cleaning layer of the disclosure. However, the "cleaning layer-like layer" may be different from the cleaning layer of the disclosure in terms of thickness, Mohs hardness and/or Young's modulus.

Experimental Example 1 and Comparative Example 1

In Experimental Example 1 and Comparative Example 1, a probe pin was cleaned by the same cleaning method. A difference is that Experimental Example 1 employed the probe pin cleaning pad of the disclosure, while Comparative Example 1 did not employ the probe pin cleaning pad of the disclosure. Moreover, the probe pin cleaning pad employed in Comparative Example 1 was similar to the probe pin cleaning pad employed in Experimental Example 1, and a difference is that a cleaning layer-like layer (which, however, was not the cleaning layer of the disclosure) in Comparative Example 1 was of a different composition from that of the cleaning layer of the disclosure.

Figure 5A:
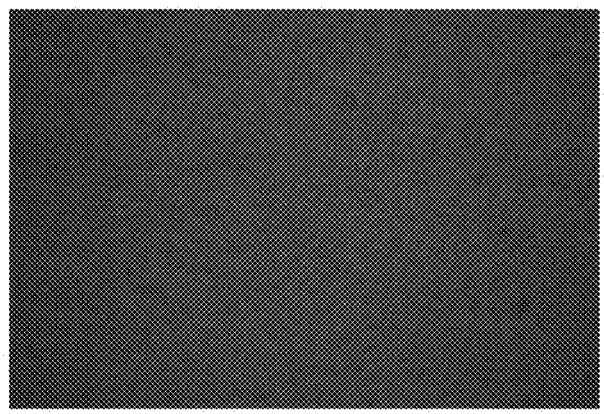
FIG. 5A and FIG. 5B are enlarged partial views of a surface of a probe pin after cleaning according to Experimental Example 1 and Comparative Example 1.
Figure 5B:
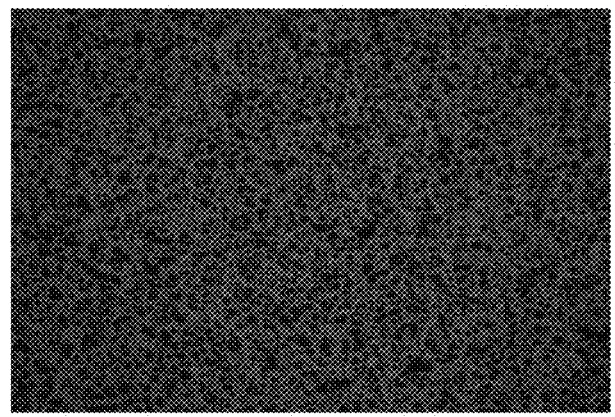

As shown in Table 1, FIG. 5A and FIG. 5B, after the probe pin was cleaned by the probe pin cleaning pad of Experimental Example 1 and the probe pin cleaning pad of Comparative Example 1, surface flatness of the probe pin cleaning pad was evaluated. FIG. 5A is an enlarged partial view of a surface of the probe pin cleaning pad after the probe pin was cleaned by the probe pin cleaning pad of Experimental Example 1. FIG. 5B is an enlarged partial view of a surface of the probe pin cleaning pad after the probe pin was cleaned by the probe pin cleaning pad of Comparative Example 1. Moreover, FIG. 5A and FIG. 5B have the same or similar image capturing conditions (for example, magnifying power and/or electron beam energy of an electron microscope). In Table 1, symbol "O" indicates that the result was at least in line with expectations or exceeded expectations, and symbol "X" indicates that the result at least did not meet expectations or was unacceptable.

TABLE 1

|  | Experiment Example 1 | Comparative Example 1 |
| --- | --- | --- |
| Surface flatness of probe pin cleaning pad | O | X |

As shown in Table 1, FIG. 5A and FIG. 5B, compared to Comparative Example 1, the probe pin cleaning pad after the probe pin was cleaned by the probe pin cleaning pad of Experimental Example 1 exhibited better surface flatness. That is, the probe pin after cleaning by the probe pin cleaning pad of Experimental Example 1 may have fewer scratches and/or fewer impurities thereon.

Experimental Example 2 and Comparative Example 2

In Experimental Example 2 and Comparative Example 2, a probe pin was cleaned by the same cleaning method. A difference is that Experimental Example 2 employed the probe pin cleaning pad of the disclosure, while Comparative Example 2 did not employ the probe pin cleaning pad of the disclosure. Moreover, the probe pin cleaning pad employed in Comparative Example 2 was similar to the probe pin cleaning pad employed in Experimental Example 2, and a difference is that a cleaning layer-like layer (which, however, was not the cleaning layer of the disclosure) in Comparative Example 2 was of a different composition from that of the cleaning layer of the disclosure.

Figure 6A:
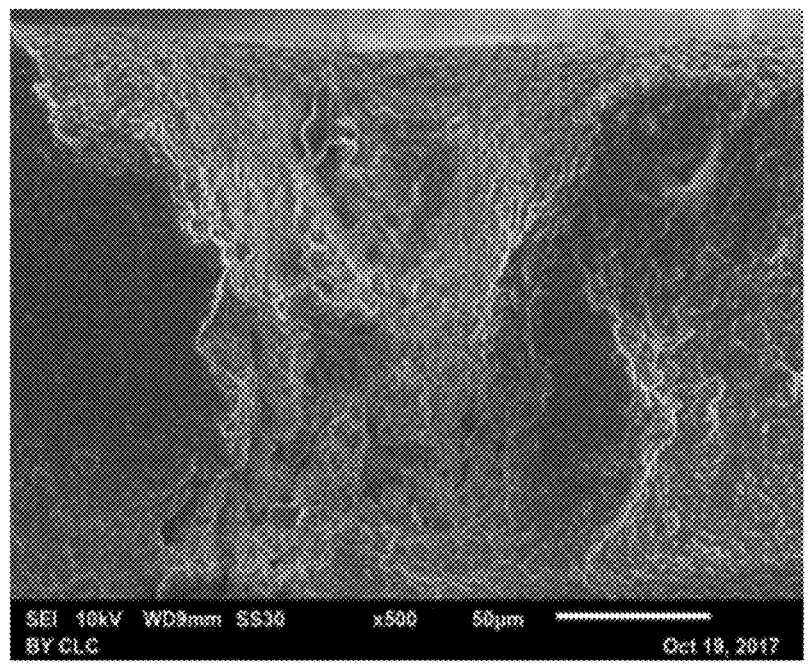
FIG. 6A and FIG. 6B are enlarged partial cross-sectional views of a probe pin cleaning pad after use according to Experimental Example 2 and Comparative Example 2.
Figure 6B:
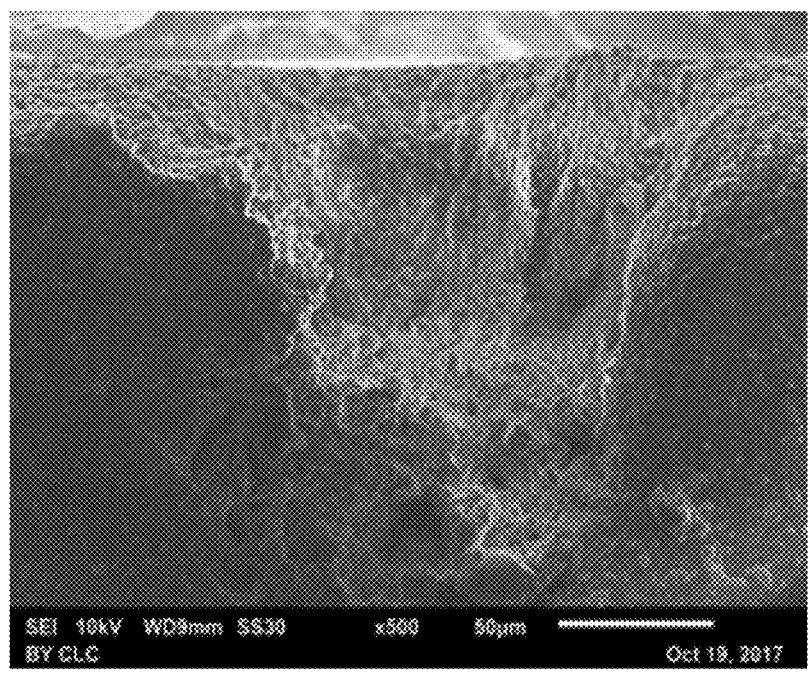

As shown in Table 2, FIG. 6A and FIG. 6B, after the probe pin was cleaned by the probe pin cleaning pad of Experimental Example 2 and the probe pin cleaning pad of Comparative Example 2, impurity adhesion ability of the probe pin cleaning pads was evaluated. FIG. 6A is an enlarged partial cross-sectional view of the probe pin cleaning pad of Experimental Example 2 after use. FIG. 6B is enlarged partial cross-sectional view of the probe pin cleaning pad of Comparative Example 2 after use. Moreover, FIG. 6A and FIG. 6B have the same or similar image capturing conditions (for example, magnifying power and/or electron beam energy of an electron microscope). In Table 2, symbol "O" indicates that the result was at least in line with expectations or exceeded expectations, and symbol "X" indicates that the result at least did not meet expectations or was unacceptable.

TABLE 2

|  | Experiment Example 2 | Comparative Example 2 |
| --- | --- | --- |
| Elasticity or adhesion | O | X |

As shown in Table 2, FIG. 6A and FIG. 6B, compared to Comparative Example 2, the cleaning layer of the probe pin cleaning pad of Experimental Example 2 exhibited better elasticity or adhesion. Thus, after the probe pin cleaning pad and the probe pin were separated from each other, punctures caused in the cleaning layer of the probe pin cleaning pad of Experimental Example 2 were relatively small due to the better elasticity or adhesion of the cleaning layer.

Experimental Example 3 and Comparative Example 3

In Experimental Example 3 and Comparative Example 3, a commercially available four jaw probe pin (a type of vertical probe pin) was cleaned by the same cleaning method (for example, the same puncturing method). A difference is that Experimental Example 3 employed the probe pin cleaning pad of the disclosure, while Comparative Example 3 did not employ the probe pin cleaning pad of the disclosure. The probe pin cleaning pad employed in Comparative Example 3 was similar to the probe pin cleaning pad employed in Experimental Example 3, and a difference is that a cleaning layer-like layer (which, however, was not the cleaning layer of the disclosure) in Comparative Example 3 had a Young's modulus of less than 30 kg/cm$^2$. Specifically, the cleaning layer of the probe pin cleaning pad employed in Experimental Example 3 had a Young's modulus of greater than or equal to 50 kg/cm$^2$ and less than or equal to 70 kg/cm$^2$.

Figure 7A:
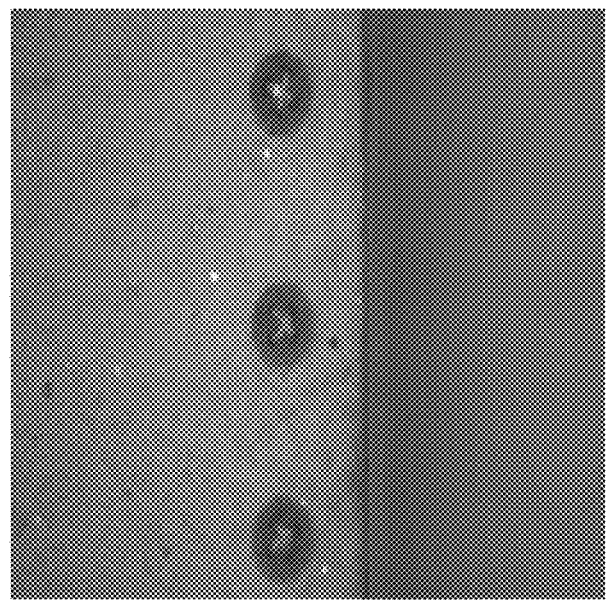
FIG. 7A and FIG. 7B are enlarged partial views of a probe pin cleaning pad after use according to Comparative Example 3.
Figure 7B:
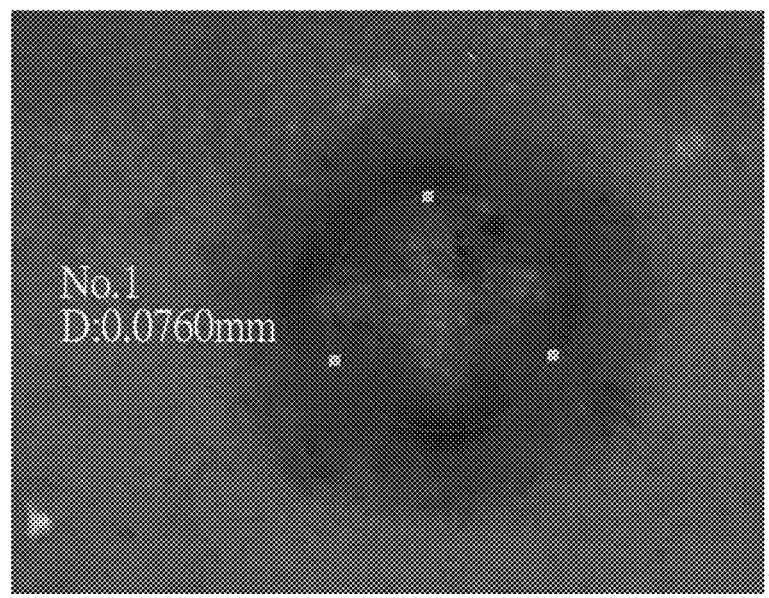
Figure 8A:
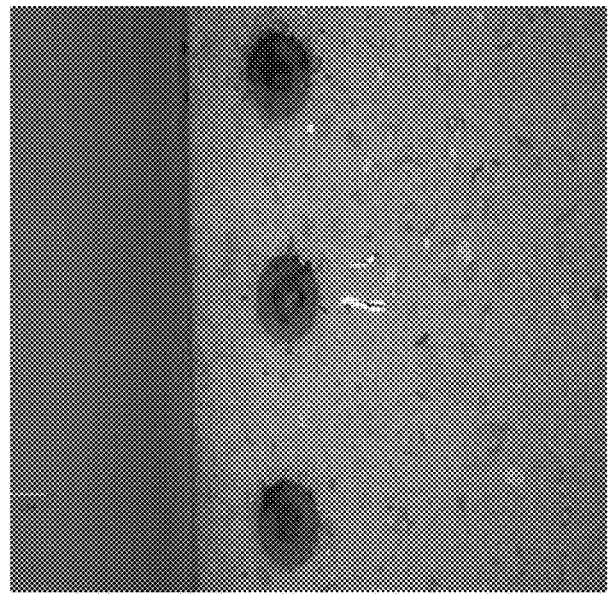
FIG. 8A and FIG. 8B are enlarged partial views of a probe pin cleaning pad after use according to Experimental Example 3.
Figure 8B:
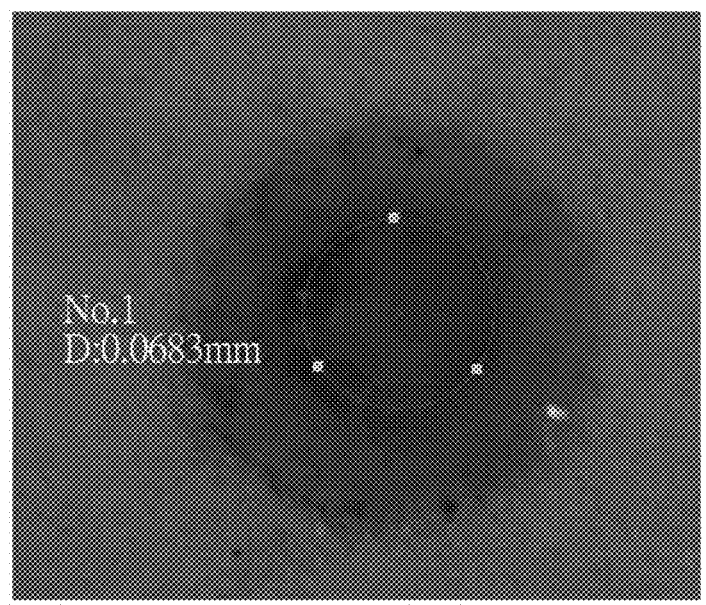

As shown in FIG. 7A, FIG. 7B, FIG. 8A and FIG. 8B, after the probe pin was cleaned by the probe pin cleaning pad of Experimental Example 3 and the probe pin cleaning pad of Comparative Example 3, surfaces of the probe pin cleaning pads were evaluated. Among them, FIG. 7A and FIG. 8A have the same or similar image capturing conditions (for example, magnifying power, imaging light amount and/or imaging angle). In addition, FIG. 7A shows that puncturing was performed less than 300 times at the same position (that is, corresponding to one hole in FIG. 7A; there are three holes in FIG. 7A) on the probe pin cleaning pad of Comparative Example 3. FIG. 7B is an enlarged view corresponding to one of the holes in FIG. 7A. In addition, FIG. 8A shows that puncturing was performed more than 1500 times at the same position (that is, corresponding to one hole in FIG. 8A; there are three holes in FIG. 8A) on the probe pin cleaning pad of Experimental Example 3. FIG. 8B is an enlarged view corresponding to one of the holes in FIG. 8A.

As shown in FIG. 7A and FIG. 7B, after less than 300 times of puncturing, corresponding punctures were caused in the probe pin cleaning pad of Comparative Example 3. In comparison between FIG. 7A and FIG. 8A, it is clear that the probe pin cleaning pad of Comparative Example 3 had relatively deep punctures. That is, it is clear that relatively serious piercing damage (for example, a noticeable cross image in FIG. 7B) occurred in the probe pin cleaning pad of Comparative Example 3 after less than 300 times of puncturing. A cause of the piercing damage may be relatively poor resilience of the material due to the Young's modulus of the probe pin cleaning pad of Comparative Example 3 of less than 30 kg/cm$^2$. When the same image processing method was employed for determination (that is, the same image processing method was applied in FIG. 7B and FIG. 8B), as shown in FIG. 7B, the probe pin cleaning pad of Comparative Example 3 had corresponding holes of about 0.076 mm after less than 300 times of puncturing.

As shown in FIG. 8A and FIG. 8B, after more than 1500 times of puncturing, corresponding punctures might still be caused in the probe pin cleaning pad of Experimental Example 3. However, in comparison between FIG. 7A and FIG. 8A, it is clear that the probe pin cleaning pad of Experimental Example 3 had relatively unnoticeable or shallow punctures. That is, there might be less noticeable piercing damage (for example, FIG. 8B shows no noticeable cross image) in the probe pin cleaning pad of Experimental Example 3 after more than 1500 times of puncturing. A reason may be that the probe pin cleaning pad of Experimental Example 3 had a Young's modulus of greater than or equal to 30 kg/cm$^2$ (or further, greater than or equal to 50 kg/cm$^2$), thus imparting relatively good resilience to the material. When the same image processing method was employed for determination (that is, the same image processing method was applied in FIG. 7B and FIG. 8B), as shown in FIG. 8B, the probe pin cleaning pad of Experimental Example 3 had corresponding holes of about 0.0683 mm after more than 1500 times of puncturing.

As shown in FIG. 7A, FIG. 7B, FIG. 8A, and FIG. 8B, compared to Comparative Example 3, the probe pin cleaning pad of Experimental Example 3 may have a relative large number of effective uses.

In summary, in the probe pin cleaning pad and the cleaning method for a probe pin by using the probe pin cleaning pad according to the disclosure, since the cleaning layer is adapted to adhere to a substance on the probe pin, the probe pin cleaning pad and the cleaning method for a probe pin are suitable for cleaning of probe pins and may reduce scratches on the probe pins.

What is claimed is:

1. A probe pin cleaning pad, comprising:
   a release layer or composite material;
   an adhesive layer, disposed on the release layer or composite material;
   a substrate layer, disposed on the adhesive layer;
   a cleaning layer, disposed on the substrate layer, wherein a material of the cleaning layer comprises:
      silicone resin having a cross-linked network structure; and
      organic particles, wherein the organic particles have a Mohs hardness of less than 7; and
   a polishing layer, disposed on the cleaning layer, wherein a material of the polishing layer comprises:
      resin; and
      inorganic particles, wherein the inorganic particles have a Mohs hardness of large than or equal to 7,
         wherein a Young's modulus of the polishing layer is larger than a Young's modulus of the cleaning layer,
         wherein the probe pin cleaning pad is adapted for a probe pin with a plurality of substance attached thereto to penetrate through the polishing layer and to further penetrate into the cleaning layer for cleaning, and during the probe pin separating being sequentially extracted from the cleaning layer and the polishing layer, the plurality of substance are removed from the probe pin and are captured and/or trapped in the cross-linked network structure of the silicon resin of the cleaning layer.

2. The probe pin cleaning pad according to claim 1, wherein the release layer or composite material, the adhesive layer, the substrate layer, the cleaning layer, and the polishing layer are sequentially stacked.

3. The probe pin cleaning pad according to claim 1, wherein two opposite surfaces of the cleaning layer is directly contact the substrate layer and the polishing layer, and in the process of cleaning an object by using the probe pin cleaning pad, the polishing layer is a first layer in contact with the object among the layers of the probe pin cleaning pad.

4. The probe pin cleaning pad according to claim 1, wherein the cleaning layer has a Mohs hardness of less than 7, or has a Young's modulus of less than or equal to 100 kg/cm$^2$.

5. The probe pin cleaning pad according to claim 1, wherein the organic particles are not catalysts during a reaction for forming the silicone resin.

6. A cleaning method for a probe pin, comprising:
   step 1: testing an electronic component by the probe pin; and
   step 2: after step 1, cleaning the probe pin by the probe pin cleaning pad according to claim 1.

7. The cleaning method for a probe pin according to claim 6, wherein step 1 and step 2 are performed in-situ or on-line.

\* \* \* \* \*